United States Patent
Lu et al.

(10) Patent No.: US 6,925,614 B2
(45) Date of Patent: Aug. 2, 2005

(54) SYSTEM AND METHOD FOR PROTECTING AND INTEGRATING SILICON INTELLECTUAL PROPERTY (IP) IN AN INTEGRATED CIRCUIT (IC)

(75) Inventors: Cheng-Yu Lu, Hsin-Chu (TW); Jun-Jyeh Hsiao, Hsin-Chu (TW); Louis Liu, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 71 days.

(21) Appl. No.: 10/404,246

(22) Filed: Apr. 1, 2003

(65) Prior Publication Data
US 2004/0199885 A1 Oct. 7, 2004

(51) Int. Cl.$^7$ .............................................. G06F 17/50
(52) U.S. Cl. ...................... 716/1; 716/5; 716/8; 716/10; 716/11
(58) Field of Search ............................... 716/1–2, 4–6, 716/8–14

(56) References Cited

U.S. PATENT DOCUMENTS

| | | | | |
|---|---|---|---|---|
| 5,913,101 A | * | 6/1999 | Murofushi et al. | 438/6 |
| 6,077,304 A | * | 6/2000 | Kasuya | 703/14 |
| 6,308,309 B1 | * | 10/2001 | Gan et al. | 716/8 |
| 6,505,323 B1 | * | 1/2003 | Lipton et al. | 716/3 |

* cited by examiner

Primary Examiner—Vuthe Siek
(74) Attorney, Agent, or Firm—Slater & Matsil, L.L.P.

(57) ABSTRACT

System and method for integrated circuit (IC) design using silicon intellectual property (IP) libraries that permits the protecting of the designs of circuits in the silicon IP while allowing correctness verification of the IC design. A preferred embodiment comprises a phantom cell (for example, phantom cell 505) that contains circuit elements (for example, circuit element EL-A 510) connected to each input/output pin of the phantom cell. The inclusion of the circuit elements permits an engineering design tool to check for improperly connected wiring.

24 Claims, 6 Drawing Sheets

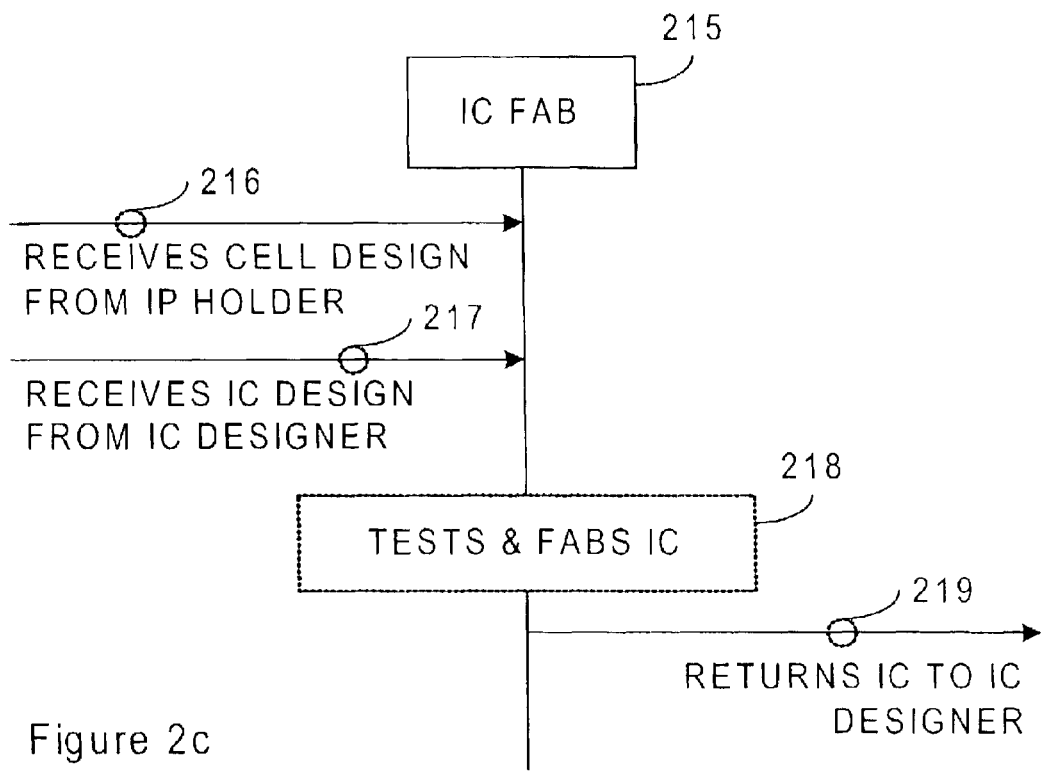
Figure 2c
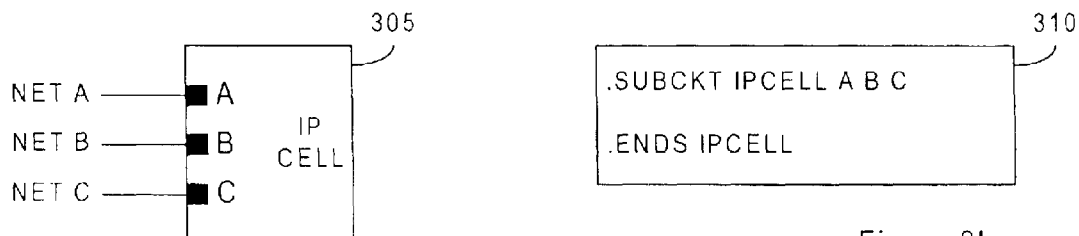
Figure 3a
Figure 3b

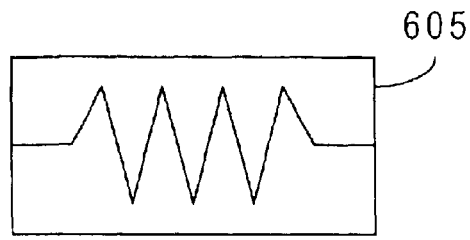
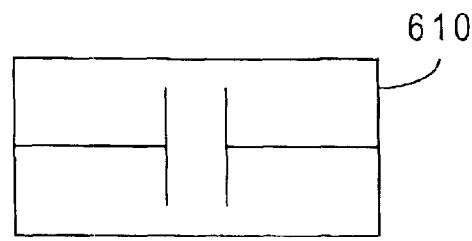
Figure 6a                Figure 6b
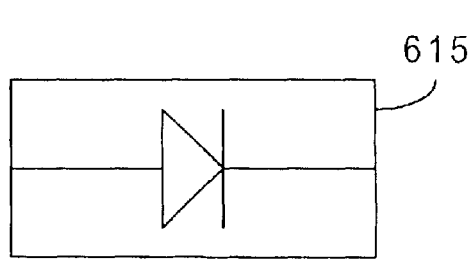
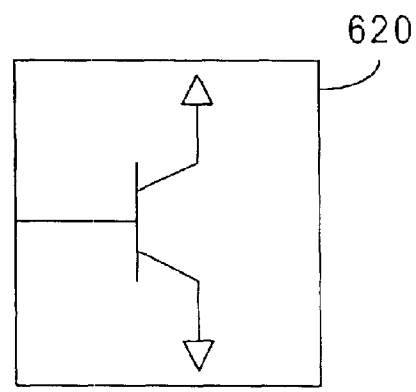
Figure 6c
Figure 6d
```
.SUBCKT IPCELL A B C
RA A NODE1 5K
RB B NODE2 6K
RC C NODE3 7K
.ENDS IPCELL
```
— 705
Figure 7

SYSTEM AND METHOD FOR PROTECTING AND INTEGRATING SILICON INTELLECTUAL PROPERTY (IP) IN AN INTEGRATED CIRCUIT (IC)

TECHNICAL FIELD

The present invention relates generally to a system and method for integrated circuit design using cells, and more particularly to a system and method permitting verification of a design of an integrated circuit (IC) using silicon IP (intellectual property) while affording a level of protection for the silicon IP.

BACKGROUND

A rapidly growing sector of the high-technology community are companies that specialize in the design of frequently used or specific-purpose silicon IP for use in the creation of custom designed integrated circuits (IC). Such a company would have a library (or multiple libraries) of different circuits that it could license to IC designers for use in IC design. The IC designers would design whole ICs by connecting the circuits together, thus saving design time by eliminating the need to custom design the circuitry of the standard cells. For example, if the IC designers were designing an IC that features several central processing units (CPUs), phase-lock loops, counters, adders, receive and transmit circuitry, and so forth, the IC designers could simply insert circuits that performed the needed functions rather than creating the functions from scratch.

An added feature of using silicon IP is that the technology used to fabricate the IC designs can be rapidly changed when the IC fabrication technology changes. New silicon IP, wherein the circuits are designed using a new technology, can readily be used in place of existing silicon IP, wherein the circuits are designed using an older technology. The IC design can then be recompiled with the new silicon IP without requiring changes to the design of the IC.

Such flexibility places a significant value on well-designed silicon IP. Therefore, the companies that design the silicon IP do as much as they can to protect the design of their silicon IP. The companies owning the silicon IP libraries are commonly referred to as IP owners.

A commonly used technique to protect the silicon IP owner's property rights is to send to the IC designer empty models of the circuits in the silicon IP library. The empty models of the circuits are sometimes referred to as phantom views. The empty models contain only footprint descriptions and pin layouts of each of the circuit in the silicon IP library. The footprint of a circuit normally contains physical information about the circuit, such as the width and depth of the circuit along with pin information for net connections. The IC designers would then design their ICs with the phantom views and then transmit their completed design to an IC fabricator (IC fab), who may be the IP owner or has a contractual agreement with the IP owner, and therefore has access to the actual circuit designs. The phantom views used by the IC designers are then replaced by the actual circuit designs. The IC can then be verified for correctness and fabricated.

One disadvantage of the prior art is that since the phantom views only contain footprint and pin information, it is impossible for the IC designer to automatically verify the correctness of the IC's design. Rather, the IC designer must rely on the IC fab (who has access to the actual standard cells) to verify the correctness of the design. If problems are encountered, the IC fab must make the corrections, since the actual circuit designs are never provided to the IC designer.

A second disadvantage of the prior art is that since the IC fab must perform the correctness verification, it places a bottleneck at the IC fab, who may not have the manpower or equipment power to perform a thorough correctness verification on the IC. Additionally, by having the IC fab perform the correctness verification, the IC designer incurs greater costs since the IC designer cannot perform the verification in house.

A third disadvantage of the prior art is that since the IC fab performs the correctness verification, it may not be able to perform as complete a correctness verification as the IC designer would wish, therefore the probability of an improperly functioning IC may be greater than desired. The improperly functioning IC is not detectable until the actual IC is fabricated and a considerable amount of time and money is expended.

SUMMARY OF THE INVENTION

These and other problems are generally solved or circumvented, and technical advantages are generally achieved, by preferred embodiments of the present invention which provides a system and a method for protecting valuable silicon IP and at the same time, permitting an IC designer the ability to perform correctness verification of the IC design.

In accordance with a preferred embodiment of the present invention, a method for designing integrated circuits (IC) using phantom cells comprising designing an IC using the phantom cells, wherein the designing comprises placing phantom cells of desired type in the IC, connecting pins located on the phantom cells to nets in the IC, and verifying correctness of the IC design.

In accordance with another preferred embodiment of the present invention, a phantom cell for use in designing integrated circuits (IC) comprising a cell having a width and length, at least one pin in the cell, and a circuit element having at least one terminal, wherein the terminal is coupled to the pin.

An advantage of a preferred embodiment of the present invention is that the owner of the silicon IP can protect his property by not having to provide the actual designs to customers.

A further advantage of a preferred embodiment of the present invention is that the IC designer can perform correctness verification of the IC designs and catch potential mistakes before transmitting the design to the IC fab, saving both time and money.

Yet another advantage of a preferred embodiment of the present invention is that the IC fab does not have to perform correctness verification, permitting faster turn-around time for the fabrication of the ICs. Therefore, the IC fab can produce a greater number of ICs for more customers.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 2a through 2c are figures illustrating possible sequence of actions by an IP holder, an IC designer, and an IC fab;

FIGS. 3a through 3d are figures illustrating a phantom cell and how it is used to protect the property rights of an IP holder during the design process of an IC;

FIGS. 6a through 6d are figures illustrating several different circuit elements that may be used in phantom cells permitting the detection of wiring errors, according to a preferred embodiment of the present invention;

FIG. 7 is a diagram illustrating a spice file description of a phantom cell permitting the detection of wiring errors, according to a preferred embodiment of the present invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the use of protected silicon IP in the design of custom integrated circuits. The invention may also be applied, however, to other situations such as the use of silicon IP wherein the underlying technology is not fixed, but yet correctness verification is needed.

Figure 1:
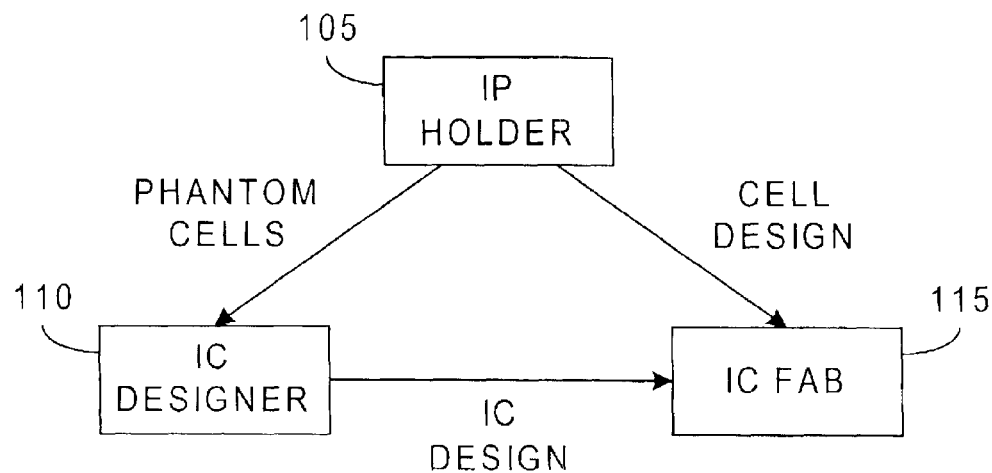
FIG. 1 is a figure illustrating a possible relationship between an intellectual property (IP) holder, an integrated circuit (IC) designer, and an IC fab (fabricator)

With reference now to FIG. 1, there is shown a diagram illustrating a possible relationship between an IP (intellectual property) holder 105, an IC (integrated circuit) designer 110, and an IC fab (fabricator) 115. The IP holder 105 is the entity that designed the silicon IP and licenses their use to the IC designer 110 for use in ICs that are designed by the IC designer 110. The IC fab 115 is the entity that is responsible for taking the IC designs created by the IC designer 110 and making the ICs.

Since the IP holder 105 designed the silicon IP, often implementing special and creative designs to optimize the performance of the silicon IP, the IP holder 105 often does not wish the designs of circuits in the silicon IP to be available to persons outside of the company. Therefore, the IP holder 105 will commonly provide the IC designer 110 with only footprint descriptions of the circuits making up the silicon IP. A footprint description of a circuit typically specifies the physical dimensions of the circuit, along with a list of input and output pins. The footprint description of the circuit, along with the input/output pin information is sometimes referred to as phantom cells or phantom views. The footprint description in a phantom cell typically will provide the dimensional specifications of the actual circuit. For example, the footprint description may specify the width and depth of the actual circuit. Note that the phantom cells will normally not contain any information about the implementation of the functional portion of the circuit.

The IC designer 110 uses the phantom cells in the design of ICs, as if they contained the actual implementation of the circuit. The IC designer 110 would connect the phantom cells, using the provided input/output pin information, to other phantom cells, clocks, power supplies, data inputs, data outputs, and so forth. Once complete, the IC designer 110 sends the completed design to the IC fab 115. The IC fab 115 has possession of the actual standard cells as created by the IP holder 105. The IP holder 105 permits this since there is no other alternative (unless the IP holder 105 does the IC fabrication as well), and since usually, there is an agreement between the IP holder 105 and the IC fab 115 pertaining to maintaining secrecy of the design of the circuits in the silicon IP.

The IC fab 115 replaces the phantom cells used by the IC designer 110 with the actual circuits from the silicon IP. Since the IC designer 110 is not able to perform correctness verification on the IC design, the IC fab 115 performs the correctness verification. Since IC fab 115 is performing the verification, it ends up costing the IC designer 110 more than if the IC designer 110 was able to perform the verification. Additionally, if the IC fab 115 has a lot of work, it may take an extended amount of time prior to the IC fab 115 being able to perform the verification. Also, the IC fab 115 may not be able or willing to perform a correctness verification with a level of detail as great as the IC designer 110 wishes. If errors are detected, the IC fab 115 notifies the IC designer 110 and the IC design is modified. Once the verification is complete, the IC fab 115 creates the IC and returns the completed product to the IC designer 110.

A commonly occurring problem that arises when an IC is not fully verified for correctness is an inoperable (or incorrectly operating) IC once fabricated. Because the IP holder 105 only provided the IC designer 110 with phantom cells, it is very difficult for the IC designer 110 to verify the correctness of the design. Automatic design tools, such as tools commonly referred to as Layout Versus Schematic (LVS) tools cannot check the correctness of the designs since the phantom cells are empty. This places the verification onto the shoulders of the IC fab 115, something that it may not be capable of performing.

Figure 2A:
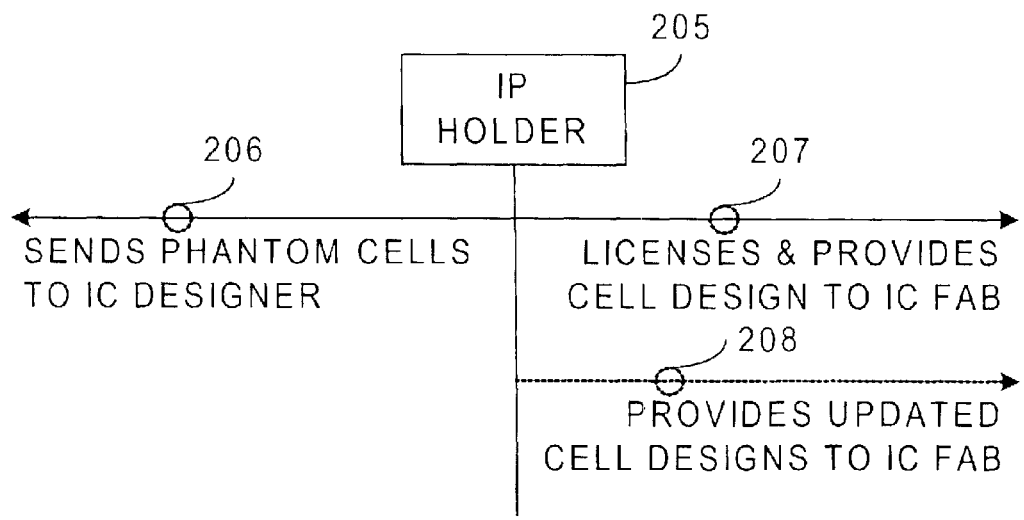

With reference now to FIG. 2a, there is shown a diagram of an IP holder 205 and a possible sequence of actions performed by the IP holder 205. The IP holder 205, upon licensing its silicon IP technology to an IC designer (not shown) sends a set of phantom cells to the IC designer (highlight 206). The phantom cells usually do not contain much more information than the footprint of each of the circuits in the silicon IP and the input/output pin configuration for the circuits. The IP holder 205 will, upon contractual agreement, send its actual circuit designs (highlight 207) to an IC fab (not shown). Additionally, should the IP holder 205 make any updates to the designs of the circuits in its silicon IP, it may send the updates to the IC fab (highlight 208).

Figure 2B:
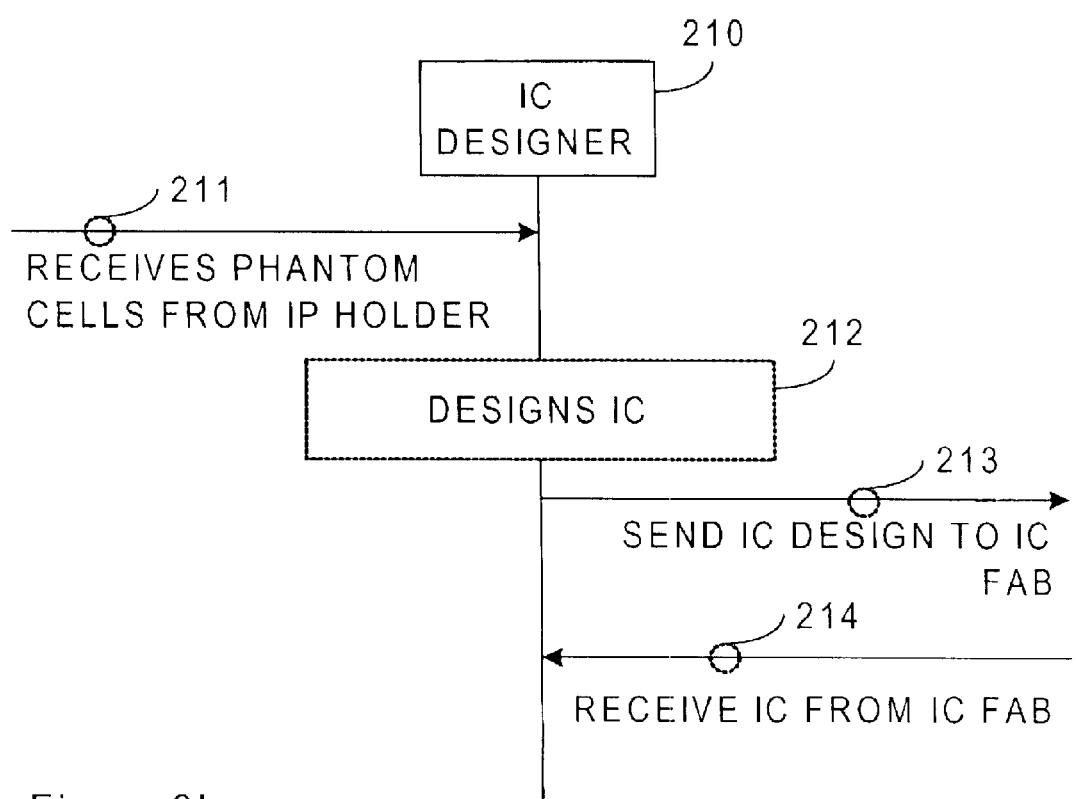

With reference now to FIG. 2b, there is shown a diagram of an IC designer 210 and a possible sequence of actions performed by the IC designer 210. The IC designer 210, upon licensing a silicon IP technology from an IP holder (not shown) and receiving the phantom cells from the IP holder (highlight 211) begins to design its ICs (block 212). Once complete with the designs, the IC designer 210 sends the IC designs (highlight 213) to an IC fab (not shown). Where, after some time, the IC fab will return fabricated ICs.

With reference now to FIG. 2c, there is shown a diagram of an IC fab 215 and a possible sequence of actions performed by the IC fab 215. The IC fab 215, upon entering a contractual agreement with an IP holder (not shown), receives designs for the circuits in the silicon IP from the IP holder (highlight 216). The IC fab 215 also receives a completed IC design (highlight 217) from an IC designer (not shown). Since the IC designer is not able to perform correctness verification, the IC fab 215 performs testing on the IC design and once the testing is complete, fabricates the IC (block 218). Once fabrication is complete, the IC fab 215 returns the completed ICs to the IC designer (highlight 219).

As discussed previously, the IC design process is relatively straightforward when using phantom cells. The IC designer creates a custom IC using the phantom cells provided by the IP holder. The footprint information, along with the pin information, provides the needed information for placing and connecting the phantom cells. When the design of the custom IC is complete, the IC designer sends the design to the IC fab. The IC fab replaces the phantom cells used by the IC designer with the actual circuit designs and tests the design for correctness. Once the design is tested, the IC is fabricated.

With reference now to FIG. 3a, there is shown a diagram of an exemplary phantom cell 305 for a circuit in a silicon IP library, wherein the circuit has three ports (input/output pins). The phantom cell 305, as illustrated in FIG. 3a has three ports (input/output pins), labeled A, B, and C. These three pins are connected to three nets, labeled NET A, NET B, and NET C. The phantom cell 305 also has a generic name IPCELL. The phantom cell 305 provides only the physical dimensions of the circuit that it represents and the location and number of input/output pins. Usually, no other information is provided.

With reference now to FIG. 3b, there is shown a figure illustrating a spice model file 310 of a phantom cell, wherein the phantom cell has three ports. In addition to providing the phantom cell, IP holders sometimes provide spice model files of the phantom cells. As illustrated in FIG. 3b, the spice model file 310 is describing the phantom cell 305 illustrated in FIG. 3a. Since there is no circuitry in the phantom cell 305 other than that it has three pins, the spice model file 310 is empty, with exception of the naming of the three pins; A, B, and C. Spice models are engineering software tool language descriptions of electrical and electronic circuits and are considered to be well understood by those of ordinary skill in the art of the present invention.

Figure 3C:
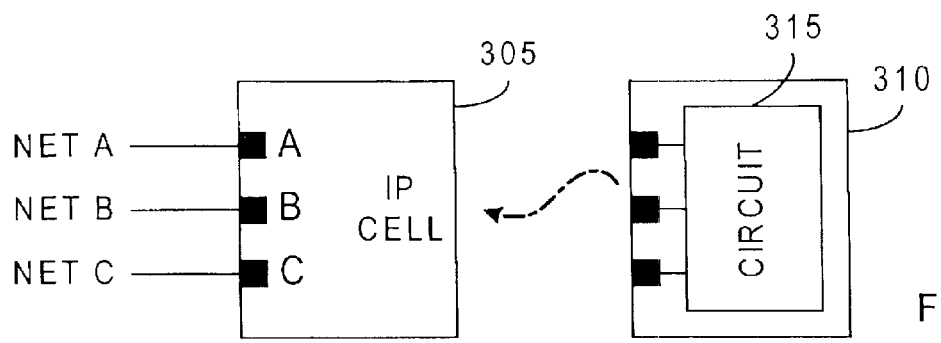

With reference now to FIG. 3c, there is shown a figure illustrating an actual circuit design 310 replacing a phantom cell. After the IC designer completes the design of the IC and sends it to the IC fab, the IC fab replaces all phantom cells in the design with corresponding circuit. For example, as illustrated in FIG. 3c, the phantom cell 305, named IPCELL is replaced by an actual circuit design 310. The actual circuit design 310 contains a description of the actual circuit that implements the phantom cell 305, IPCELL. If the design contains more than one instance of the phantom cell 305, then the standard cell 310 may be inserted into each instance of the phantom cell 305. Alternatively, the standard cell 310 is inserted only into the first instance of the phantom cell 305 and subsequent instances of the phantom cell 305 will refer to the initial instance.

Since the phantom cell 305 and the actual circuit design 310 are normally both described (specified) in some form of hardware description language (HDL), the replacement of the phantom cell 305 with the actual circuit design 310 may be a relatively simple task. For example, a section of HDL describing the phantom cell 305 can simply (and normally automatically) be replaced with a section of HDL describing the actual circuit design 310. Alternatively, HDL code that describes the entire IC design can be parsed and wherever there are references to the phantom cell 305, the references can be replaced with references to the actual circuit design 310.

Figure 3D:
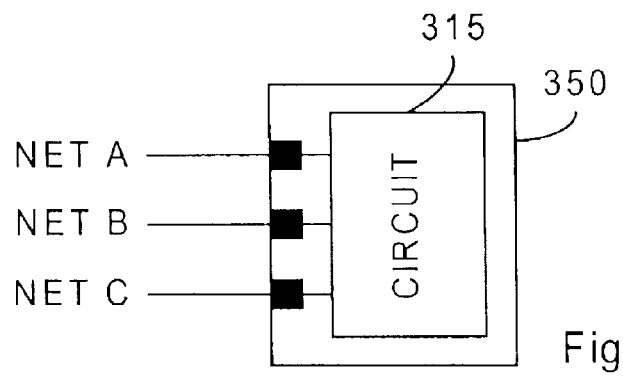

With reference to FIG. 3d, there is shown a figure illustrating a portion of an IC with a phantom cell after the phantom cell has been replaced by an actual circuit 350 from a silicon IP library. As illustrated, the portion of the IC displayed the same as is displayed in FIG. 3a. Since the footprint of the phantom cell is identical to the footprint of the corresponding circuit from a silicon IP library, the figures are essentially identical, with the exception of an actual layout 315 contained in the actual circuit 350 and not present in the phantom cell (not shown).

Figure 4:
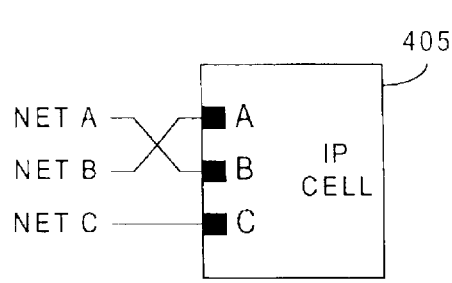
FIG. 4 is a figure illustrating a possible error that is not detectable via the use of engineering tools when phantom cells are used in the IC design process.

With reference now to FIG. 4, there is shown a figure illustrating a possible wiring error that is not detectable when using phantom cells. A relatively common wiring error to make is to cross-wire a pair of pins. As illustrated in FIG. 4, NET A is wired to pin B while NET B is wired to pin A, when the intended connections are NET A to pin A and NET B to pin B. NET C is correctly wired to pin C. Due to the fact that a phantom cell 405 is used and there are no circuit elements in the phantom cell 405, when an engineering design tool, such as an LVS tool, is used to perform correctness checking, it cannot check if the wiring is done correctly. Therefore, a commonly occurring wiring mistake is not checked.

Other wiring mistakes, such as mis-wiring a single net into more than one pin, multiple nets into one pin, and so forth, are also not detectable when using phantom cells in the IC design process. This is due to the fact that there are no circuit elements inside the phantom cells. Therefore, when a LVS tool generates a net listing (netlist) all of the nets maybe displayed as floating (meaning that they are not connected to anything). As such, correctness verifications generally cannot occur.

Figure 5:
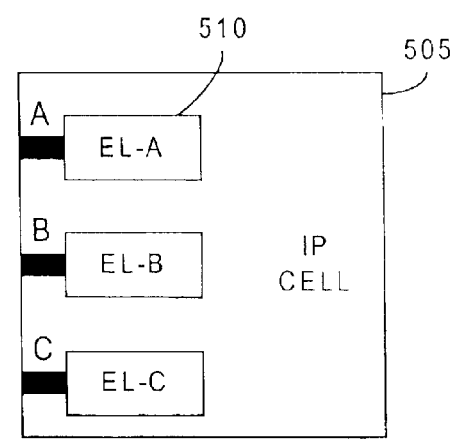
FIG. 5 is a figure illustrating a phantom cell that does permit the detection of wiring errors via the use of engineering tools, according to a preferred embodiment of the present invention.

With reference now to FIG. 5, there is shown an exemplary phantom cell 505 that permits correctness verification, according to a preferred embodiment of the present invention. The phantom cell 505 differs from phantom cells displayed earlier (such as phantom cell 305 (FIG. 3a)) in that internal to the phantom cell 505, the pins are connected to circuit elements, for example, element EL-A 510. According to a preferred embodiment of the present invention, each pin in the phantom cell 505 is connected to a unique circuit element. For example, as displayed in FIG. 5, the phantom cell 505 has three pins, and each pin is displayed as being connected to a different circuit element. The circuit elements within a single phantom cell may be of the same type, for example, resistors, capacitors, diodes, transistors, and so forth, or they may be a mix of different circuit elements, with more than one type of circuit element in a single phantom cell. Of course, in addition to having the circuit elements, the phantom cell 505 may also provide footprint information, such as width and depth, and pin information.

With a circuit element connected to each pin (preferably, each circuit element having a unique value), when a net is connected to a pin of a phantom cell, the net will no longer be floating. Using the phantom cell 505 in FIG. 5 as an example, if a net, NET A, is connected to pin A, then the net, NET A, will be connected to circuit element, EL-A 510. Therefore, when a LVS tool generates a netlist, the net, NET A, will be shown as being connected to circuit element, EL-A 510. Then, if circuit element, EL-A 510, was a resistor of value 5 k ohms (kilo-ohms), for example, then the netlist will show that the net, NET A is connected to a 5 k ohm resistor. If the sizes of the circuit elements are unique and are consistently sized across the various phantom cells and if the LVS tool knows what pin a net is supposed to be connected to and since it knows the value of the circuit element that is connected to the pin, then a simple comparison will allow the LVS tool to determine if the net is connected to the correct pin. For example, if the net, NET A, is intended to be connected to pin A which is connected to a 5 k ohm resistor, but due to a wiring error is connected to pin B which is connected to a 6 k ohm resistor, then the LVS tool will note that the net, NET A, is connected to a 6 k ohm resistor instead of a 5 k ohm resistor. Therefore, a wiring mistake must have occurred. It would then flag the mistake and permit the IC designer to correct the mistake.

With reference now to FIGS. 6a–6d, there are shown several different circuit elements that may be connected to pins in phantom cells, according to a preferred embodiment of the present invention. Note that while FIGS. 6a through 6d show four different circuit elements: a resistor (perhaps a poly-resistor) 605 (FIG. 6a), a capacitor 610 (FIG. 6b), a diode 615 (FIG. 6c), and a transistor 620 (FIG. 6d), circuit elements of basically any kind may be used in the phantom cells. However, to permit correctness verification, the circuit elements used within a single phantom cell should be distinguishable from one another.

With reference now to FIG. 7, there is shown a figure illustrating a spice model file 705 of a phantom cell with circuit elements, wherein the phantom cell has three ports, according to a preferred embodiment of the present invention. As illustrated in FIG. 7, the spice model file 705 is describing the phantom cell 505 illustrated in FIG. 5. Because there are circuit elements coupled to the pins of the phantom cell 505, there are entries in the spice model file 705. For example, if the circuit elements were resistors with values of 5 k, 6 k, and 7 k ohms, then a spice model file for the phantom cell could appear as displayed in FIG. 7.

Figure 8:
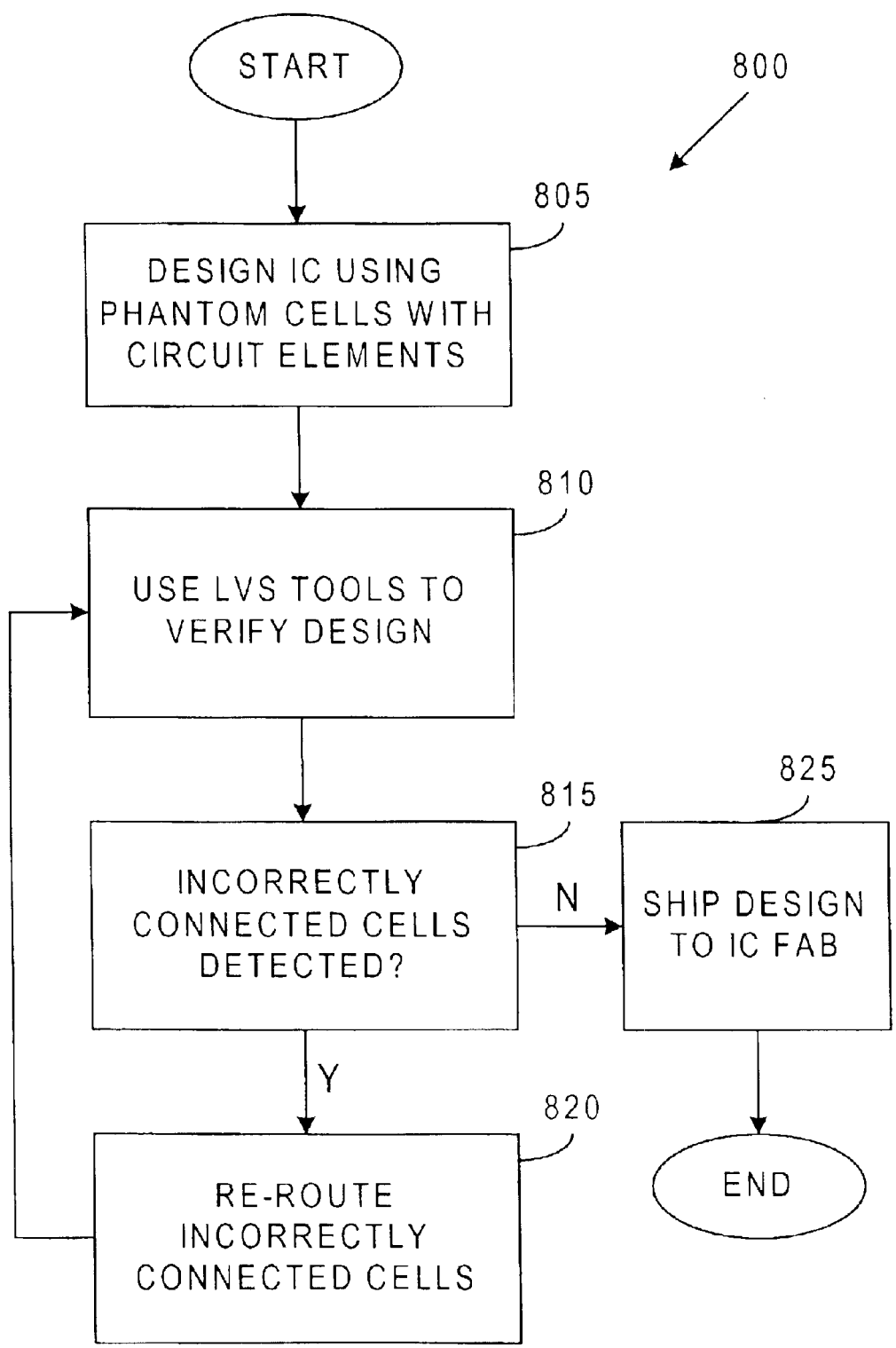
FIG. 8 is a diagram illustrating an IC design process making use of phantom cells permitting the detection of wiring errors, according to a preferred embodiment of the present invention.

With reference now to FIG. 8, there is shown a flow diagram 800 illustrating a process that may be used to design and verify IC designs using phantom cells with circuit elements, according to a preferred embodiment of the present invention. The process begins with an IC designer designing an IC using phantom cells with circuit elements in the phantom cells (block 805) rather than the typical phantom cells which are basically just footprint information. Once the IC design is complete, the IC designer can use a LVS tool (or some other engineering tool) to verify the correctness of the design (block 810).

When the correctness verification is complete, the LVS tool may report that there are some incorrectly connect cells in the IC design (block 815). With incorrectly connected cells, the IC design should be fixed. The IC design can be fixed by the IC designer by noting where the incorrectly connected cells are and fixing the wiring (block 820). With the cells re-wired, the LVS tools are used to once again verify the correctness of the design (block 810). This can be repeated until the LVS tool no longer detects any incorrectly connected cells. If there are no incorrectly connected cells (block 815), then the IC designer can send the IC design to an IC fab for fabrication (block 825). With the IC design sent to the IC fab, the process is complete.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for designing an integrated circuit (IC) comprising:

placing phantom cells of desired type in the IC, wherein the phantom cells each comprise an input/output pin and a circuit element, the circuit element being coupled to the pin, and the circuit element representing a device type and value;

connecting pins located on the phantom cell to nets in the IC; and verifying correctness of the IC design using the device type and value representations provided by the circuit elements in the phantom cells, wherein the verifying comprises:

determining a characteristic of an expected circuit element that is expected to be coupled to a net;

comparing the characteristic of the phantom circuit element that is coupled to the net and the characteristic of the expected circuit element; and determining that the net is wired correctly if the characteristics of the phantom circuit element and the expected circuit element are approximately equal.

2. The method of claim 1, wherein for each of at least some of the phantom cells, the phantom cell has multiple pins and multiple circuit elements.

3. The method of claim 2, wherein each of the multiple circuit elements in a given phantom cell has a unique value.

4. The method of claim 3, wherein the circuit elements in a the given phantom cell are of the same device type.

5. The method of claim 4, wherein the circuit elements ate resistors.

6. The method of claim 3, wherein the circuit elements in a the given phantom cell are of a mixed type of circuit element.

7. The method of claim 3, wherein the circuit elements in one phantom cell are different in type from the circuit elements in another phantom cell.

8. The method of claim 3, wherein the circuit elements in all phantom cells are of the same type.

9. The method of claim 1, wherein the phantom cells correspond to circuits from a silicon intellectual property (IP) library.

10. The method of claim 1, wherein the verifying is performed by an engineering design tool.

11. The method of claim 10, wherein the engineering design tool is a layout-versus-schematic (LVS) tool.

12. The method of claim 1, wherein the verifying is repeated for every net in the IC.

13. The method of claim 12, wherein the IC design is incorrect if at least one net is incorrectly wired.

14. The method of claim 1, wherein there is more than one pin in a given phantom cell, wherein there is more than one circuit element in the given phantom cell, and wherein each pin in the given phantom cell is coupled to a terminal of a different circuit element.

15. The method of claim 14, wherein each circuit element is selected from a group consisting of a resistor, a poly-resistor, a capacitor, a transistor, and a diode.

16. The method of claim 1, wherein the method further comprises providing the phantom cells to an IC designer, wherein the actual cells represented by the phantom cells are put of an intellectual property library.

17. The method of claim 16, wherein the verifying correctness of the IC is performed by the IC designer.

18. The method of claim 16, wherein the method further comprises providing spice model files for the phantom cells to the IC designer, wherein the spice model files comprise entries for the circuit element types and values.

19. The method of claim 1, wherein the method further comprises generating a netlist with an engineering design tool, after the connecting of the pins, the netlist including information for the device types and values for the circuit elements of the phantom cells.

20. A method of designing an integrated circuit (IC) comprising:

placing and connecting phantom cells, wherein
the phantom cells represent in less detail actual cells,
each phantom cell comprises an input/output pin and a circuit element connected to the pin,
the circuit element represents a device type and value, and
the phantom cell has a footprint area;
connecting pins of the phantom cells to nets in the IC;
after the connecting of the pins, verifying correctness of the IC using the device type and value representation provided by the circuit elements of the phantom cells, wherein the verifying comprises:
determining a characteristic of an expected circuit element that is expected to be coupled to a net;
comparing the characteristic of the phantom circuit element that is coupled to the net and the characteristic of the expected circuit element; and
determining that the net is wired correctly if the characteristics of the phantom circuit element and the expected circuit element are approximately equal.

21. The method of claim 20, wherein the method further comprises providing the phantom cells to an IC designer, wherein the actual cells represented by the phantom cells are part of an intellectual property library.

22. The method of claim 21, wherein the verifying correctness of the IC is performed by the IC designer.

23. The method of claim 21, wherein the method further comprises providing spice model files for the phantom cells to the IC designer, wherein the spice model files comprise entries for the circuit element types and values.

24. The method of claim 20, wherein the method further comprises generating a netlist with an engineering tool, after the connecting of the pins, the netlist including information for the device types and values for the circuit elements of the phantom cells.

* * * * *

UNITED STATES PATENT AND TRADEMARK OFFICE
CERTIFICATE OF CORRECTION

PATENT NO. : 6,925,614 B2
DATED : August 2, 2005
INVENTOR(S) : Lu et al.

It is certified that error appears in the above-identified patent and that said Letters Patent is hereby corrected as shown below:

Column 8,
Line 59, delete "a".
Line 60, delete "ate" and insert -- are --.
Line 63, delete "a" before "the".

Column 10,
Line 33, insert -- design -- between "engineering" and "tool".

Signed and Sealed this

Sixth Day of December, 2005

JON W. DUDAS
*Director of the United States Patent and Trademark Office*